US 6,724,658 B2

(12) United States Patent
Micheloni et al.

(10) Patent No.: US 6,724,658 B2
(45) Date of Patent: Apr. 20, 2004

(54) METHOD AND CIRCUIT FOR GENERATING REFERENCE VOLTAGES FOR READING A MULTILEVEL MEMORY CELL

(75) Inventors: Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/133,231

(22) Filed: Apr. 26, 2002

(65) Prior Publication Data
US 2002/0192892 A1 Dec. 19, 2002

Related U.S. Application Data

(63) Continuation-in-part of application No. 10/047,918, filed on Jan. 14, 2002.

(30) Foreign Application Priority Data

Jan. 15, 2001 (EP) .............................. 01830017
Apr. 27, 2001 (EP) .............................. 01830276

(51) Int. Cl.[7] .............................................. G11C 16/00
(52) U.S. Cl. .............................. 365/185.21; 365/185.11
(58) Field of Search ........................ 365/185.11, 185.21, 365/189.09

(56) References Cited

U.S. PATENT DOCUMENTS 5,999,454 A   12/1999  Smith ................... 365/185.21
6,009,022 A   12/1999  Lee et al. ............... 365/189.09
6,034,888 A    3/2000  Pasotti et al. .......... 365/185.03
6,097,635 A    8/2000  Chang ................... 365/185.21
6,134,147 A   10/2000  Kaneda ................. 365/185.25
6,507,183 B1 *  1/2003  Mulatti et al. .......... 365/185.11

FOREIGN PATENT DOCUMENTS

EP        0 833 340 A1     4/1998
WO       WO 00/42615       7/2000

* cited by examiner

Primary Examiner—Tan Nguyen

(57) ABSTRACT

The circuit for generating reference voltages for reading a multilevel memory cell includes the following: a first memory cell and a second memory cell respectively having a first reference programming level and a second reference programming level; a first reference circuit and a second reference circuit respectively connected to said first and said second memory cells and having respective output terminals which respectively supply a first reference voltage and a second reference voltage; and a voltage divider having a first connection node and a second connection node respectively connected to the output terminals of the first reference circuit and of the second reference circuit to receive, respectively, the first reference voltage and the second reference voltage, and a plurality of intermediate nodes supplying respective third reference voltages at equal distances apart.

14 Claims, 6 Drawing Sheets

METHOD AND CIRCUIT FOR GENERATING REFERENCE VOLTAGES FOR READING A MULTILEVEL MEMORY CELL

CROSS-REFERENCE(S) TO RELATED APPLICATION(S)

This application is a continuation-in-part of U.S. patent application Ser. No. 10/047,918, filed Jan. 14, 2002, now pending, which application is incorporated herein by reference in its entirety.

BACKGROUND OF THE INVENTION

1. Field of the Invention

The present invention relates to a method and a circuit for generating reference voltages for reading a multilevel memory cell.

2. Description of the Related Art

As is known, the need for nonvolatile memories having increasingly larger densities has led to manufacturing multi-level memories wherein the information, stored as charge quantity in a floating-gate region, is encoded by fractionating the entrapped charge. In this way, the characteristic of a multilevel flash cell is described by a number of curves representing the pattern of the drain current Ids as a function of the gate voltage Vgs, each curve being associated to a different logic value. For example, FIG. 1 shows the characteristic of a four-level (2-bit) flash cell which stores the bits "11", "10", "01" and "00", corresponding to threshold voltages Vt1, Vt2, Vt3 and Vt4.

Reading of multi-level cells is carried out evaluating the current or the voltage.

Current reading is based on comparing the current flowing in a cell at a preset gate voltage Vgs and the current flowing in a reference cell, the characteristic of which is intermediate between the distributions of the programmed cells, as shown in FIG. 2. The comparison is made after a current-to-voltage conversion, both of the current of the cell and of the reference current.

Current reading has a number of problems, the main ones depend on parasitic resistances, such as source and drain-contact resistance of the cell, resistance of the metal connections, and resistance caused by the pass transistors of the column decoder.

As a whole, the result is a reduction in current dynamics. Consequently, the comparator that compares the voltages after current-to-voltage conversion must have a greater sensitivity. In addition, the actual characteristics differ with respect to the ideal ones, as shown in FIG. 3. Due to such non-idealities, current reading of multilevel memory cells having more than two bits per cell is difficult, because it is required to distinguish extremely near current levels from one another.

To overcome the above problems, U.S. Pat. No. 6,034,888, in the name of the present Applicant, proposes a voltage reading method using a closed-loop circuit (see FIG. 4). In this circuit, the current of the cell to be read is compared with a reference current, and the gate voltage of the cell is modulated until reaching the equilibrium of the system. Thereby, the gate voltage of the cell reaches a value that can be defined as the threshold value of the cell.

However, also this solution is not free from problems, due to the need for an A/D converter able to read the voltage on the gate terminal of the cell, and to the constraint of not being able to read more than one cell at a time, since the row is in common to more than one cell and cannot assume different voltage values.

The solutions devised for solving the above problems moreover involve other disadvantages (increase in read time, greater area) and in any case call for the capacity to discriminate very small currents. On the other hand, the new technologies, involving a reduction in the cell dimensions, lead in turn to a reduction in the cell current, even though solutions are known for reducing the parasitic effects that determine the losses of linearity.

BRIEF SUMMARY OF THE INVENTION

An embodiment of the present invention provides a circuit for generating reference voltages that will enable the limitations described previously to be overcome.

According to embodiments of the present invention, a method and a circuit for generating reference voltages for reading a multilevel memory cell are provided, as further defined below.

According to one embodiment of the invention, a circuit for generating reference voltages for reading a multilevel memory cell is provided, including a first reference cell and a second reference cell having, respectively, a first reference programming level and a second reference programming level. A first reference circuit and a second reference circuit are respectively connected to the first and the second reference cells and have respective output terminals which respectively supply a first reference voltage and a second reference voltage. Voltage-dividing means having a first connection node and a second connection node, respectively, are connected to the output terminals of the first and second reference circuits to receive, respectively, the first reference voltage and the second reference voltage, and additionally having a plurality of intermediate nodes supplying respective third reference voltages at equal distances apart.

Another embodiment provides a method for generating reference voltages for reading a multilevel memory cell, including reading a first memory cell and a second memory cell respectively having a first reference programming level and a second reference programming level, for generating, respectively, a first reference voltage and a second reference voltage, and generating a plurality of third reference voltages which are intermediate between the first reference voltage and the second reference voltage and are at equal distances apart.

BRIEF DESCRIPTION OF THE SEVERAL VIEWS OF THE DRAWINGS

For a better understanding of the present invention, a preferred embodiment thereof is now described, purely by way of non-limiting example, with reference to the attached drawings, in which.

DETAILED DESCRIPTION OF THE INVENTION

More recently, a dynamic reading of memory cells has been proposed, as described in pending U.S. patent application Ser. No. 10/047,918, filed Jan. 14, 2002, in the name of the present Applicant. Such proposal, which is based on time integration of the electric charge supplied to a memory cell to be read through a charging step or a discharging step of a capacitive element, will be hereinafter discussed, with reference to FIGS. 5 and 6.

Figure 1:
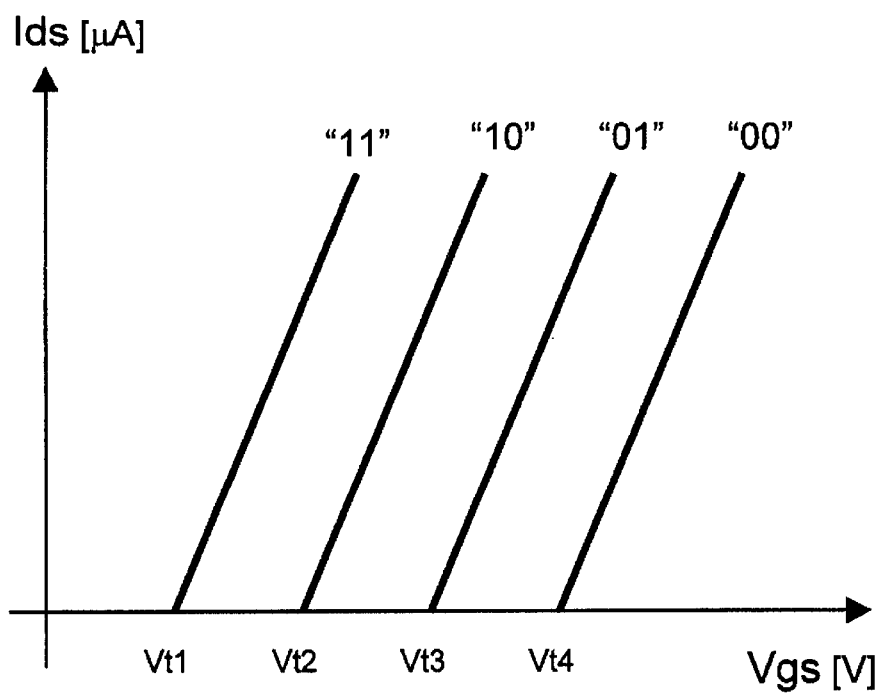
FIG. 1 shows the current-voltage characteristics of a two-bit flash memory cell.
Figure 2:
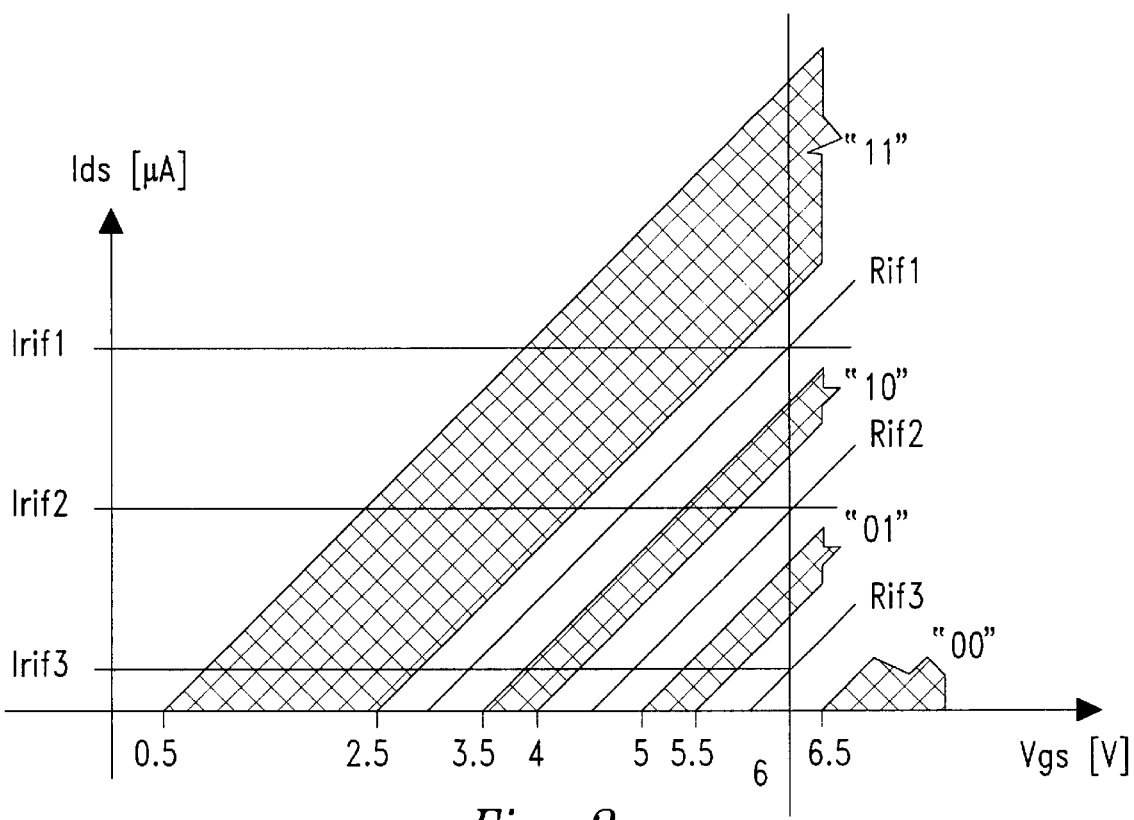
FIG. 2 shows the distribution of the characteristics of two-bit flash memory cells and of reference cells, in the case of reading in current.
Figure 3:
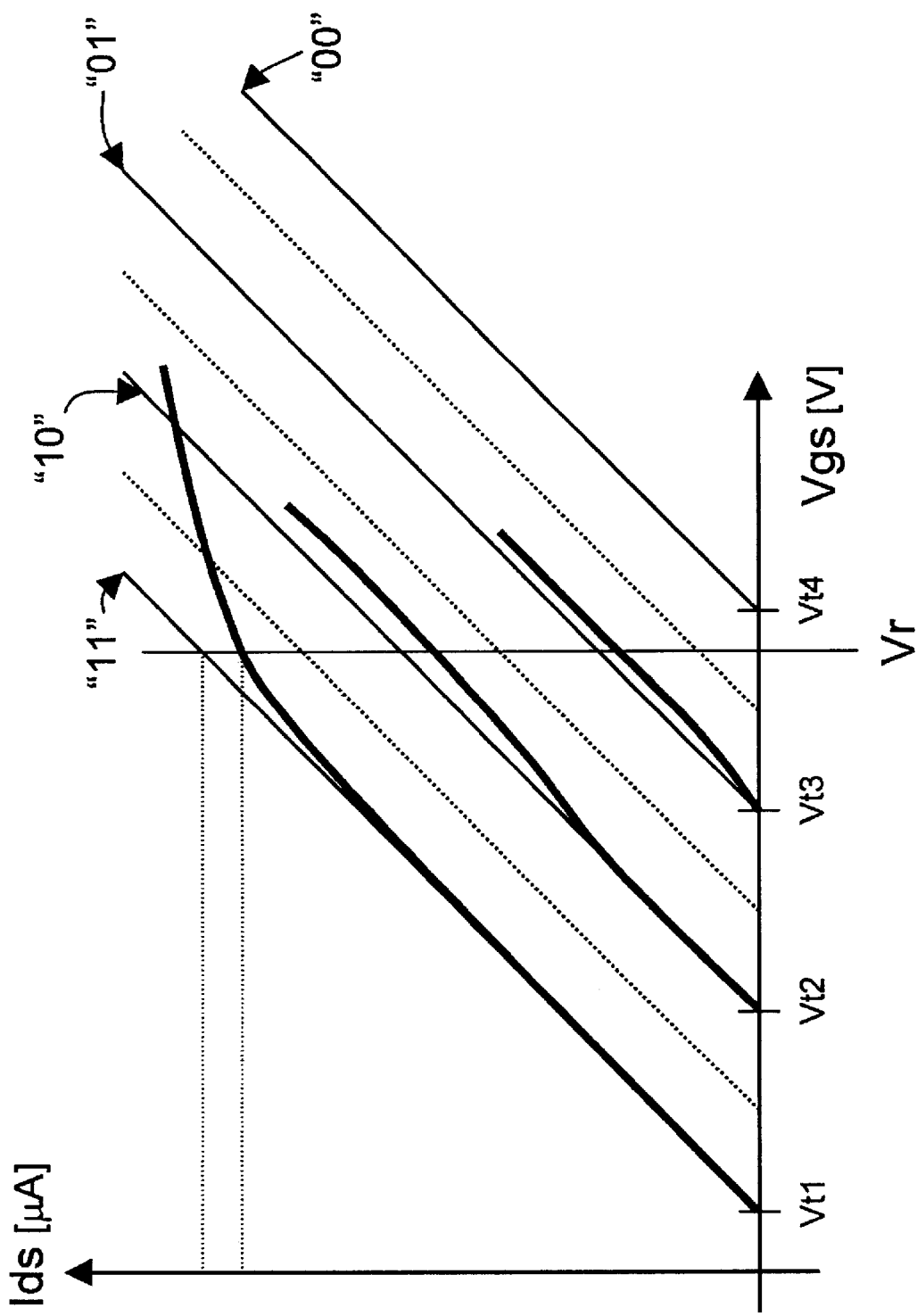
FIG. 3 presents the modification of the ideal characteristics of FIG. 1 in the presence of parasitic effects.
Figure 5:
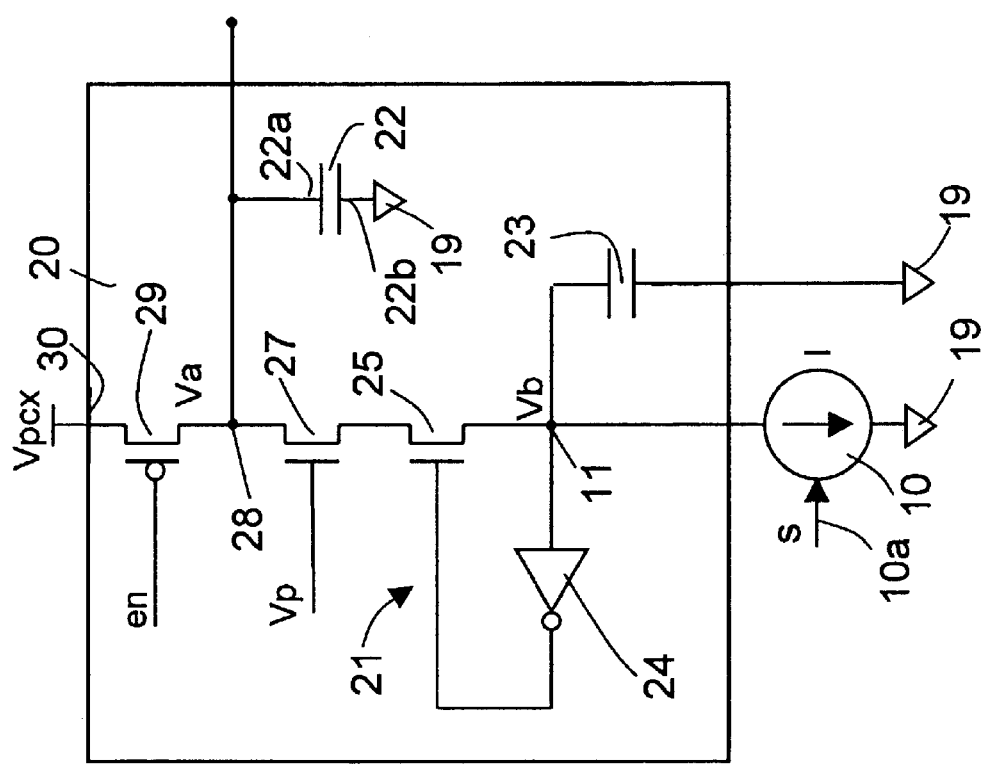
FIG. 5 shows a simplified electrical diagram of a read circuit forming the subject of a the parent patent application.
Figure 4:
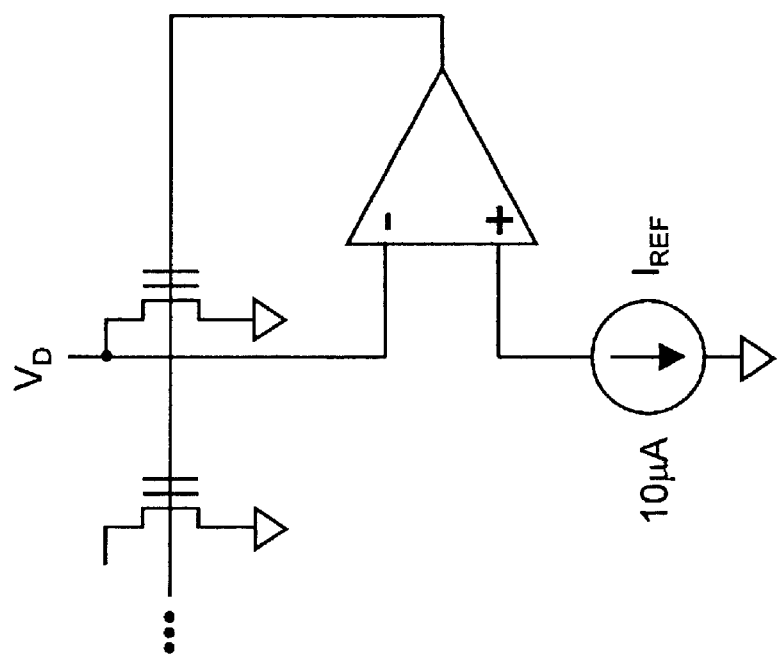
FIG. 4 shows a known circuit for reading in voltage.

In FIG. 5, a memory cell is represented by a current source 10, which is connected between a ground line or connection (hereinafter referred to as ground line 19) and a charge-transfer node 11. The current source 10 has a control node 10a receiving a first control signal s and absorbs a constant current I directed towards the ground line 19, when enabled by the first control signal s. The charge-transfer node 11 is connected to a reading circuit 20 comprising a decoupling stage 21, a charge-regeneration capacitor 22 having a capacitance Ca, and an integration capacitor 23 having a capacitance Cb.

In detail, the decoupling stage 21, formed by a circuit known as "cascode", comprises an inverting element, here an inverter 24, having an input connected to the charge-transfer node 11 and an output connected to the gate terminal of a cascode transistor 25, of NMOS type. The cascode transistor 25 moreover has a source terminal connected to the charge-transfer node 11 and a drain terminal connected to the drain terminal of a pass transistor 27, of NMOS type. The pass transistor 27 has a gate terminal receiving a second control signal Vp and a drain terminal connected to a charge-integration node 28.

The charge-regeneration capacitor 22 has a first terminal 22a connected to the charge-integration node 28 and a second terminal 22b connected to the ground line 19. The charge-integration node 28 is connected to the drain terminal of a charge transistor 29, of PMOS type. The charge transistor 29 has a source terminal connected to a biasing line 30 set at a bias voltage Vpcx and a gate terminal receiving a charge-enabling signal en. The bias voltage Vpcx can be either a standard supply voltage (e.g., of 3 V) or a boosted voltage (e.g., of 6 V) provided by a boosting device of a known type and not shown herein.

Finally, the charge-integration node 28 forms the output of the reading circuit 20, and generates a voltage Va proportional, as will be explained hereinafter, to the current I flowing in the current source 10. A voltage Vb is present on the charge-transfer node 11.

Figure 6:
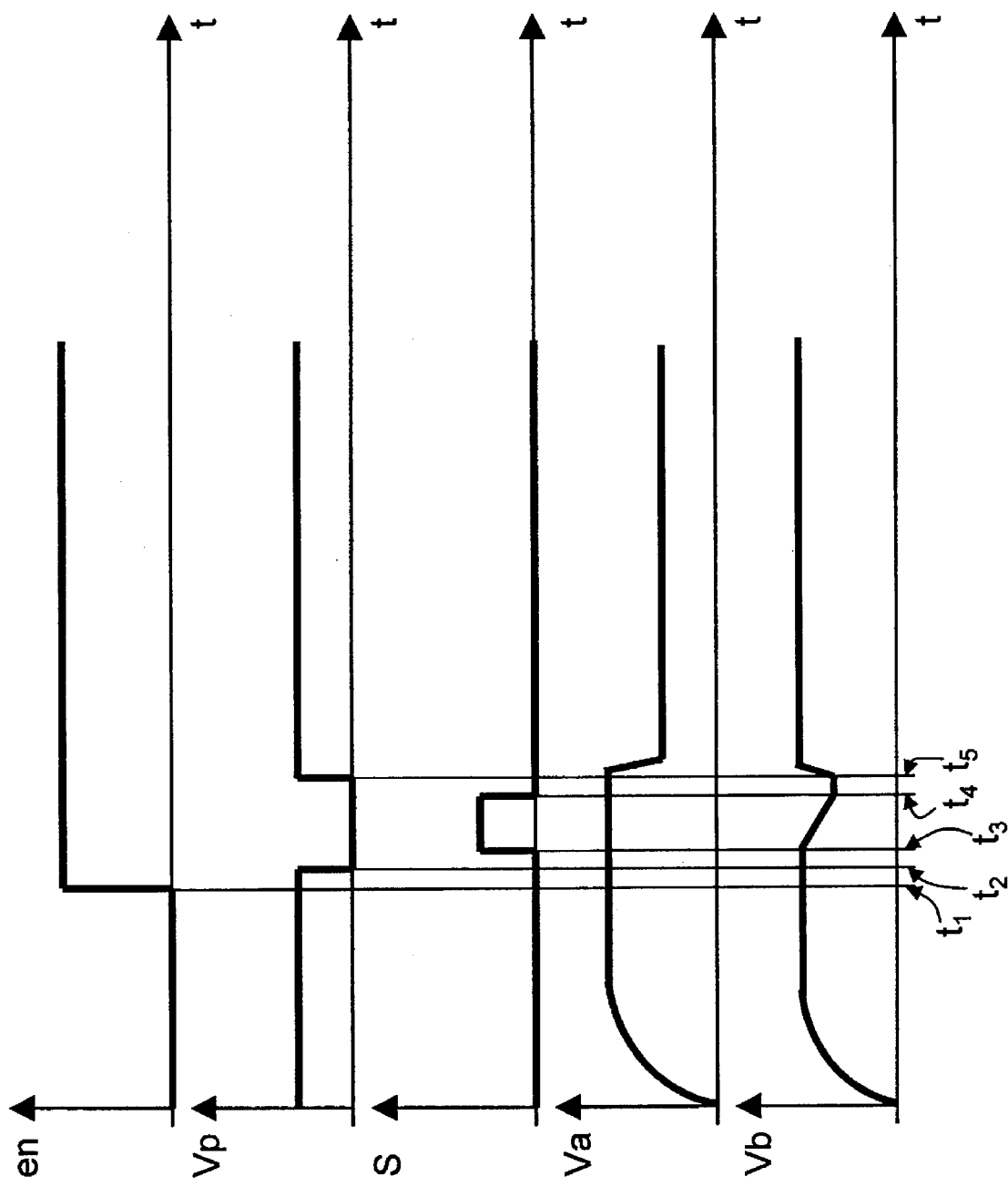
FIG. 6 shows a timing diagram of the circuit of FIG. 5.

Operation of the circuit of FIG. 5 is the following (see also FIG. 6).

Initially, the voltages Va and Vb on the charge-integration node 28 and on the charge-transfer node 11 are low. The first control signal s keeps the current source 10 off. In addition, the charge-enabling signal en is low and keeps the charge transistor 29 on. The second control signal Vp is high and keeps the pass transistor 27 on. In this condition, the output of the inverter 24 is high, and the cascode transistor 25 is on and enables charging of the integration capacitor 23 up to the threshold voltage of the inverter 24. As soon as the voltage Vb on the charge-transfer node 11 has reached the triggering voltage of the inverter 24, the latter switches and turns off the cascode transistor 25, which interrupts charging of the integration capacitor 23. In addition, the charge-regeneration capacitor 22 charges up to the bias voltage (i.e., until Va=Vpcx).

In steady-state conditions, at the end of charging, the following relations apply:

$V_{ai} = Vpcx$ $Q_{ai} = C_a V_{ai} = C_a Vpcx$ $Q_{bi} = C_b V_{bi}$ where $V_{ai}$ is the value of the voltage $V_a$ at the end of the charging step, $Q_{ai}$ is the charge stored in the charge-regeneration capacitor 22, $V_{bi}$ is the value of the voltage $V_b$ at the end of the charging step, and $Q_{bi}$ is the charge stored in the integration capacitor 23.

At the instant t1, the charge-enabling signal en switches to the high state (Vpcx) and turns off the charge transistor 29 (in this way isolating the charge-regeneration capacitor 22 from the supply line 30). Next (instant t2), the second control signal Vp switches to low and turns off the pass transistor 27 (thereby isolating the charge-transfer node 11 and the charge-integration node 28). Finally (instant t3), the first control signal s switches and turns on the current source 10, which, to a first approximation, goes to a steady-state condition in a negligibly small time, so that the integration capacitor 23 will not be affected by current transients.

Consequently, the integration capacitor 23 discharges linearly, supplying the constant current I to the current source 10 through the charge-transfer node 11. At the instant t4, the control signal s switches again and turns off the current source 10, thus interrupting the discharging step. In practice, if Δt=t4−t3 is the time interval when the current source 10 is on, ΔVb is the voltage variation on the charge-transfer node 11 for the time interval Δt, and ΔQb is the charge supplied to the current source 10, i.e., the charge lost by the integration capacitor 23, we have $V_{a,t3} = Vpcx$ $$I = C_b \frac{\Delta V_b}{\Delta t}$$

$$I \Delta t = C_b \Delta V_b = \Delta Q_b$$

$$\Delta V_b = \frac{I \Delta t}{C_b} = \frac{\Delta Q_b}{C_b}$$

For example, with $C_a$=0.5 pF and $C_b$=5 pF, the time interval Δt when discharging of the integration capacitor 23 takes place is about 60 nsec.

Next (instant t5), the second control signal Vp switches again to high, turning on the pass transistor 27 and connecting together, through the decoupling stage 21, the charge-integration node 28 and the charge-transfer node 11. Consequently, the charge-regeneration capacitor 22 discharges rapidly to the integration capacitor 23, re-integrating the charge lost by the latter, according to a charge-sharing process. In practice, the charge-regeneration capacitor 22 operates as a charge reservoir. However, the charge-integration node 28 and the charge-transfer node 11 do not assume the same potential. In fact, the decoupling stage 21 allows the charge-transfer node 11 to reach only the value of the triggering voltage of the inverter 24, after which the inverter 24 turns on the cascode transistor 25, thus once again isolating the charge-integration node 28 from the charge-transfer node 11. The charge-integration node 28, instead, goes to a voltage value $V_{af}$ given by the capacitive sharing between the integration capacitor 23 and the charge-regeneration capacitor 22 (charge-sharing step).

At the end, in steady-state conditions, the final voltage on the charge-regeneration capacitor 22 is equal to $V_{af}$, the final charge of the charge-regeneration capacitor 22 is equal to $Q_{af}$, and the charge transferred from the charge-regeneration capacitor 22 to the integration capacitor 23 is $\Delta Q_a$, equal to the charge $\Delta Q_b$ lost by the charge-regeneration capacitor (which has returned to the initial conditions). Consequently, we have $$V_{bf} = V_{bi}$$

$$V_{a,f} = \frac{Q_{af}}{C_a} = \frac{Q_{ai} - \Delta Q_a}{C_a} = \frac{Q_{ai} - \Delta Q_b}{C_a} = \frac{C_a V_{ai} - I\Delta t}{C_a} = \frac{C_a V pcx - I\Delta t}{C_a}$$

and hence $$V_{a,f} = Vpcx - \frac{I\Delta t}{C_a} \tag{1}$$

In practice, there is a linear relation between the final voltage Va on the charge-integration node 28 and the current absorbed by the current source 10. Consequently, by integrating the current absorbed by the current source 10 in a preset time interval (integration time $\Delta t$), the voltage Va on the charge-integration node 28 is proportional to the current I. Consequently, by appropriately sizing the integration time $\Delta t$ and the capacitance Ca, the value of the current I, even if very small, can be converted into a voltage value (voltage Va) having an amplitude that may be read with present-day current circuits.

In addition, from Equation (1) it is possible to calculate the variation $\Delta Va$ of the voltage Va on the charge-integration node 28 generated by variations $\Delta I$ of the current of the current source 10. In fact, from Equation (1) it is $$\frac{\Delta V_a}{\Delta I} = -\frac{\Delta t}{C_a} \tag{2}$$

Relation (2) makes it possible to distinguish very small current variations from one another by measuring the voltage difference $\Delta Va$ that may be obtained on the charge-integration node 28.

For example, setting $\Delta t=50$ ns, if a variation $\Delta Va$ of 100 mV is desired for a current variation $\Delta I=1$ $\mu A$, we obtain $$C_a = \frac{\Delta I}{\Delta V_{af}} \Delta t = 0,5 \text{ pF}$$

If it is desired a reduction of the voltage Vb on the charge-transfer node 11 of 0.5 V in 50 ns for a maximum current of 50 $\mu A$ (which is assumed as being the maximum of the dynamics for the memory cell represented schematically by the current source 10), we have $$C_b = \frac{I\Delta t}{\Delta V_b} = 5 \text{ pF}$$

With this sizing we then obtain that, for each $\mu A$ of variation in the current I of the current source 10, the voltage Va on the charge-integration node 28 varies by 100 mV, which can be detected without any problems.

Figure 7:
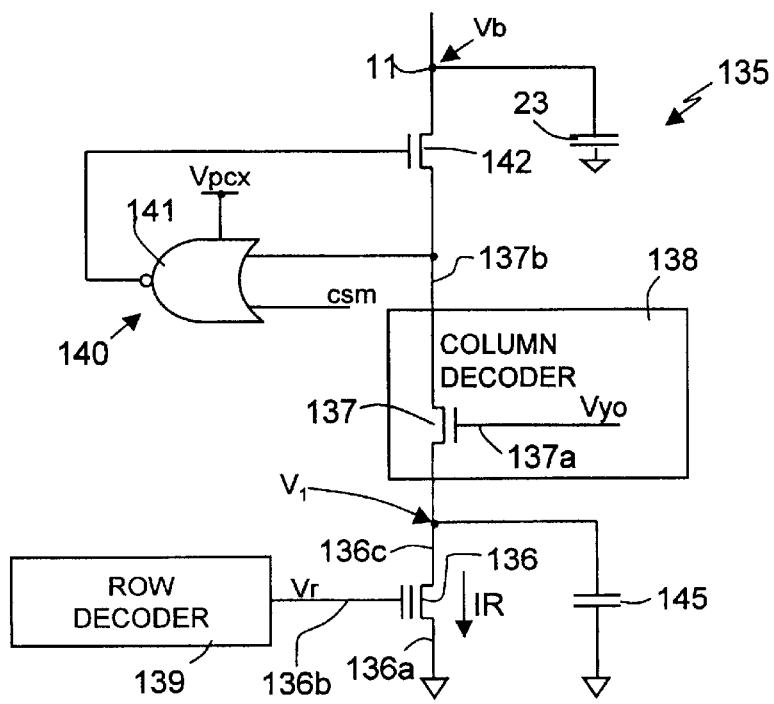
FIG. 7 is a circuit diagram corresponding to a memory cell that can be read with the read circuit of FIG. 5.

FIG. 7 shows a circuit 135 that implements the current source 10 of FIG. 5 and comprises a memory cell 136.

In detail, a memory cell 136, in particular a nonvolatile memory cells such a flash cell, has a source terminal 136a connected to the ground line 19, a gate terminal 136b biased at a read voltage Vr via a row decoder 139 (shown only schematically), and a drain terminal 136c connected to the source terminal of a decoding transistor 137 belonging to a column decoder, which is shown only schematically. The read voltage Vr is a boosted voltage Vdd, for example 6 V.

The decoding transistor 137 has a gate terminal 137a receiving a column enable signal Vyo, and a drain terminal 137b connected to the charge-transfer node 11 through a biasing circuit 140 implemented by a controllable cascode circuit.

In detail, the biasing circuit 140 comprises a NOR gate 141 and a decoupling transistor 142. The NOR gate 141 has a first input receiving a turning-on signal csm, a second input connected to the drain terminal 137b of the decoding transistor 137, and an output connected to the gate terminal of the decoupling transistor 142. The decoupling transistor 142, which is of NMOS type, has a source terminal connected to the drain terminal 137b of the decoding transistor 137 and a drain terminal connected to the charge-transfer node 11.

FIG. 7 moreover shows a column capacitor 145 representing the capacitance associated to the bit line connected to the memory cell 136 and the second capacitor 23 of FIG. 5.

In the circuit 135 of FIG. 7, initially the gate terminal 136b of the memory cell 136 is biased at the read voltage Vr (for example, 6 V). Only after the gate terminal 136b has reached the steady-state value (which in current flash memories requires a few tens of nanoseconds) does the column enable signal Vyo switch from 0 V to a high value (for example 3 V), so turning on the decoding transistor 137, which takes place in a few nanoseconds.

In this step, the turning-on signal csm is low and enables the biasing circuit 140. The latter, given its cascode structure, keeps the voltage on the drain terminal 137b of the decoding transistor 137 constant, and hence the voltage V1 on the drain terminal 136c of the memory cell 136 also constant, and approximately at 1 V. In these conditions, the memory cell 136 absorbs a constant current and the second capacitor 23 discharges linearly as long as the column enable signal Vyo remains high. The circuit 135 thus effectively operates as a constant-current source and is equivalent to the source 110, with I being the current flowing through the memory cell 136; in addition, the column enable signal Vyo in practice implements the first control signals of FIG. 5.

The read circuit described above thus enables discrimination, in a short time, of programming states that are very close to one another, in practice enabling increase in the number of bits that may be stored in a cell (for example, four bits, corresponding to 16 programming levels), but has a number of drawbacks. It is known, in fact, that, given the same programming level, the current flowing in a nonvolatile memory cell depends upon a plurality of factors of disturbance, such as the temperature, fluctuations in the supply voltage, and non-controllable variations in process parameters. Consequently, also the voltage Va on the charge-integration node 28 at the end of the charge-sharing step is not constant, and hence reading errors may occur.

In greater detail, the voltage Va on the charge-integration node 28 must be converted into a numeric signal correlated to the level of programming of the memory cell that is to be read. For this purpose, an analog-to-digital converter is used that compares the voltage Va with a plurality of reference voltages, each of which indicates a respective programming level. In the presence of the factors of disturbance referred to above, the voltage Va generated by reading of a memory cell having a given programming level may vary not only in an absolute sense, but also in relation to the reference voltages of the A-D converter. Consequently, it may happen that the reference voltage closest to the voltage Va on the charge-integration node 28 is representative of a programming level other than that of the memory cell that is being read. It is clear that, in this case, the programming level of the memory cell is not correctly recognized, and a reading error occurs.

It is moreover possible that, in the presence of the factors of disturbance referred to previously, the relative distances between the reference voltages are reduced, and hence the probability of errors occurring increases.

Figure 8:
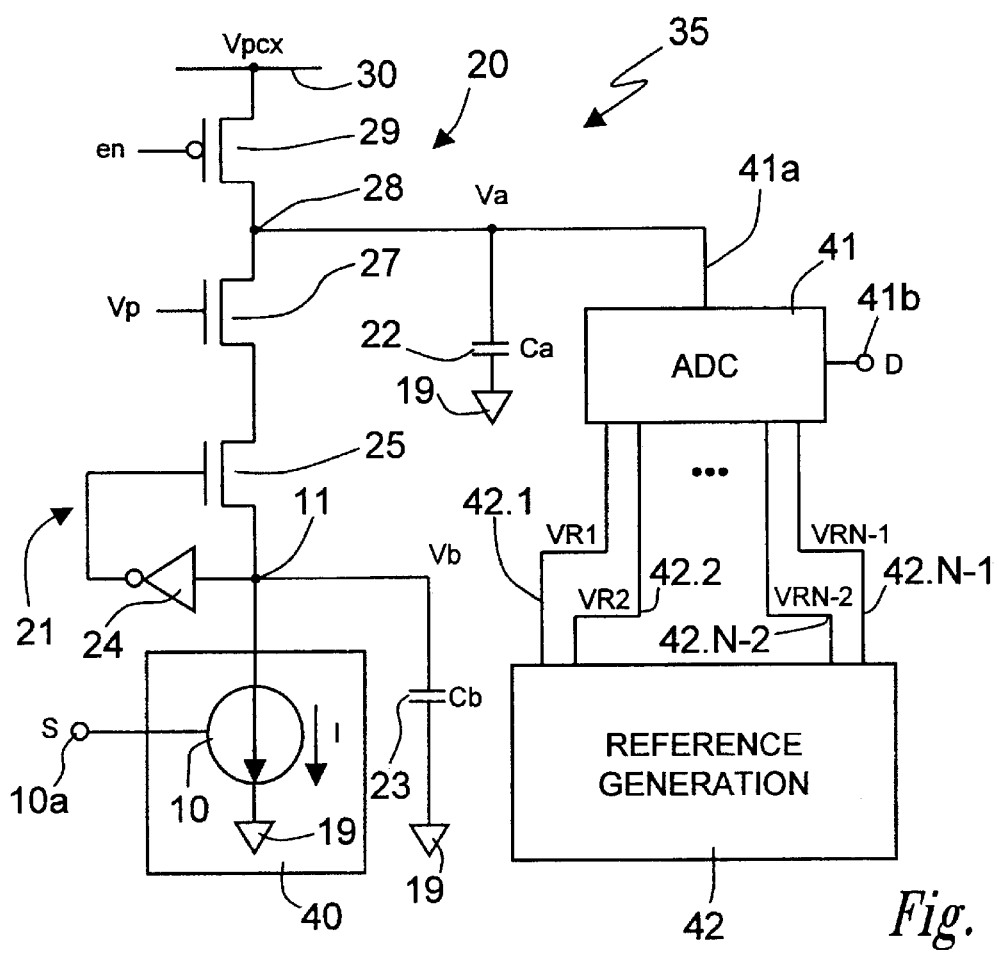
FIG. 8 shows a simplified electrical diagram of the read circuit of FIG. 5, completed with the analog-to-digital conversion part.

With reference to FIG. 8, in which parts that are identical to those already shown in FIG. 5 are designated by the same reference numbers, a memory device 35 comprises an array 40 of memory cells, one of which is here illustrated schematically by the current generator 10; in addition, the memory device 35 includes the read circuit 20 of FIG. 5, which will not be further described herein, an analog-to-digital converter 41, and a reference generating stage 42.

The A-D converter 41 has a signal input 41a connected to the charge-integration node 28 and a plurality of reference inputs, which are connected to respective output terminals 42.1, 42.2, ..., 42.N–1 of the reference generating stage 42. In addition, the A-D converter has an output 41b supplying a numerical signal D, which is correlated to the programming level of a memory cell to be read, and hence to the current I flowing in the current generator 10, as already mentioned.

In greater detail, if N designates the possible programming levels of the memory cells of the memory device 35, the number of the output terminals 42.1, 42.2, ..., 42.N–1 of the reference generating stage 42 and the number of the reference inputs of the A-D converter 41 are equal to N–1. The reference generating stage 42 supplies, on its own output terminals 42.1, 42.2, ..., 42.N–1, respective reference voltages VR1, VR2, ..., VRN–1, each of which represents a respective programming level. In addition, to clarify the concept, suppose that the reference voltages VR1, VR2, ..., VRN–1 decrease in an orderly manner from the maximum reference voltage VR1 to the minimum reference voltage VRN–1 and are at equal distances apart.

Figure 9:
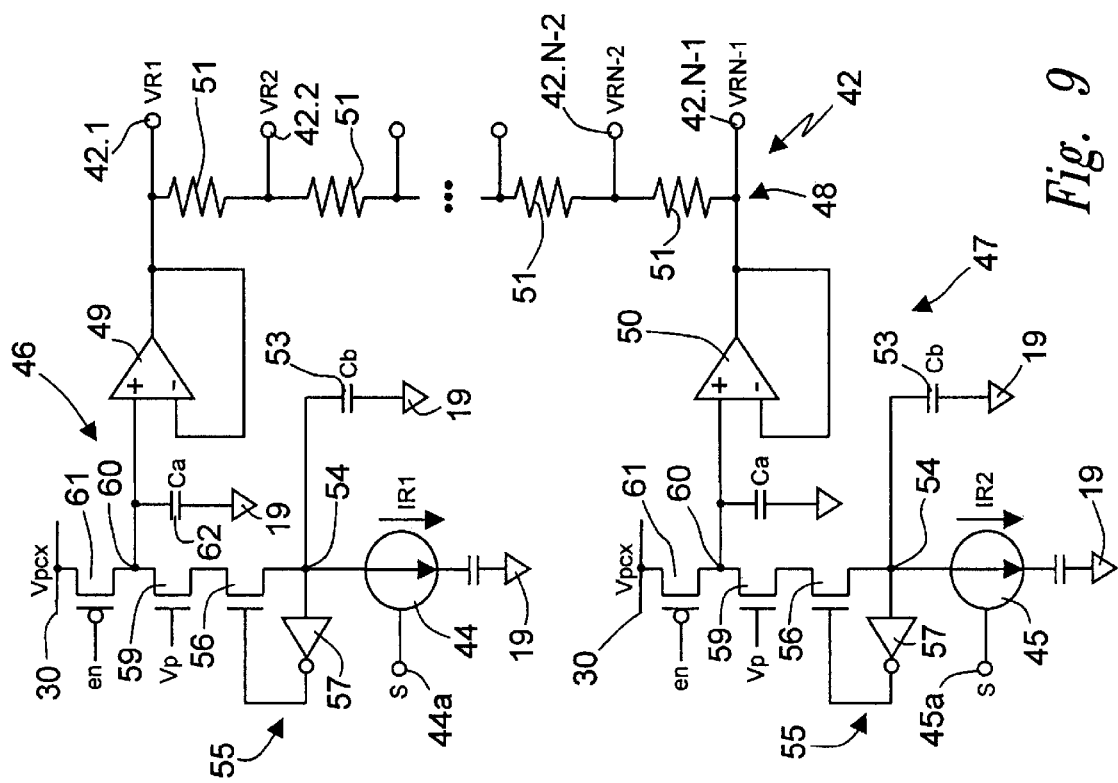
FIG. 9 shows the electrical diagram of a reference generator according to an embodiment of the invention.

As shown in FIG. 9, the reference generating stage 42 comprises a first reference current generator 44 and a second reference current generator 45, a first reference circuit 46 and a second reference circuit 47, a voltage divider 48, and a first follower stage 49 and a second follower stage 50.

Figure 10:
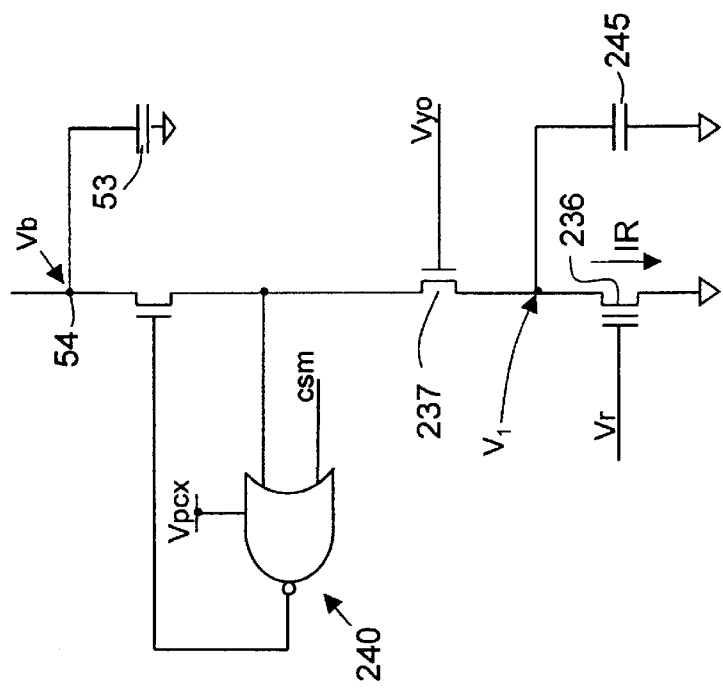
FIG. 10 shows the electrical diagram, in greater detail, of two components of the generator of FIG. 9.

The reference current generators 44, 45 represent memory cells, as described in what follows with reference to FIG. 10.

The first reference circuit 46 and the second reference circuit 47 are identical and have a structure similar to that of the read circuit 20 of FIG. 5. In particular, each of the reference circuits 46, 47 comprises a reference integration capacitor 53, which has a capacitance Cb and is connected between the ground line 19 and a reference transfer node 54; a decoupling stage 55, made up of a reference cascode transistor 56, which has its source terminal connected to the reference transfer node 54, and a reference inverter 57 connected between the source terminal and the gate terminal of the reference cascode transistor 56; a reference pass transistor 59, which has its source terminal connected to the drain terminal of the reference cascode transistor 56, its drain terminal connected to a reference integration node 60, and its gate terminal receiving the second control signal Vp; a reference charge transistor 61, which has its source terminal and drain terminal respectively connected to the biasing line 30 and to the reference integration node 60, and receives on its own gate terminal the charge-enable signal en; and a reference charge-regeneration capacitor 62, which has a capacitance Ca and is connected between the reference integration node 60 and the ground line 19. In addition, the reference integration nodes 60 constitute output terminals, respectively, of the first reference circuit 46 and of the second reference circuit 47.

The first reference current generator 44 is connected between the ground line 19 and the reference transfer node 54 of the first reference circuit 46, and has a control terminal 44a which receives the first control signal s. When activated, the first reference current generator 44 absorbs a first reference current IR1. Likewise, the second reference current generator 45 is connected between the ground line 19 and the reference transfer node 54 of the second reference circuit 47, and has a control terminal 45a which receives the first control signal s. When activated, the second reference current generator 45 absorbs a second reference current IR2.

The voltage divider 48 comprises a plurality of resistors 51 which have equal resistances and are connected in series between the output terminals 42.1, 42.2, ..., 42.N–1 of the reference generating circuit 42. The intermediate nodes, or "taps", between pairs of resistors 51 form, instead, the intermediate output terminals 42.2, ..., 42.N–2 of the reference generating circuit 42. In addition, the output terminal 42.1 is connected to the reference integration node 60 of the first reference circuit 46 via the first follower stage 49, and the output terminal 42.N–1 is connected to the reference integration node 60 of the second reference circuit 47 via the second follower stage 50.

In detail, the follower stages 49, 50 comprise respective operational amplifiers each having a non-inverting input respectively connected to the reference integration node 60 of the first reference circuit 46 and to the reference integration node 60 of the second reference circuit 47, and an output connected to the respective inverting input and respectively defining the output terminal 42.1 and the output terminal 42.N–1.

The reference current generators 44, 45 are built as shown in FIG. 5 and have the same structure as the current generator 10 shown in FIG. 7. In detail, each reference current generator 44, 45 comprises a reference memory cell 236, in particular a nonvolatile memory cell, such as a flash cell, connected between the ground line 19 and a transistor 237 simulating the decoding transistor 137 of the column decoder 138 (FIG. 7). The gate terminal of the reference memory cell 236 is biased at a read voltage Vr.

The transistor 237 has its gate terminal that receives the enabling voltage Vyo and is connected to the reference transfer node 54 via a biasing circuit 240.

A capacitor 245 also in this case represents the capacitance associated to the line to which the memory cell 236 is connected. As in the case of the current generator 10 of FIG. 7, the current IR flowing in the reference memory cell 236 is constant and correlated to the programming level of the reference memory cell 236. The desired current levels IR1, IR2 absorbed by the reference current generators 44, 45 may thus be obtained by appropriately programming the respective reference memory cells 236 during the electrical-wafer-sort (EWS) step.

Operation of the memory device 35 is described in what follows.

Initially, the memory cell 136, represented schematically by the current generator 10, is read using the procedure already described with reference to FIG. 6. A voltage Va correlated to the programming level of the memory cell to be read is therefore supplied on the charge-integration node 28.

At the same time, also the reference cells 236, one of which is represented schematically by the first reference current generator 44 and the other by the second reference current generator 45, are read using a similar procedure. In particular, first a step is performed for charging the reference integration capacitor 53 and the reference charge-regeneration capacitor 62 (FIG. 6, instant t1). The reference transfer nodes 54 of each of the reference branches 46, 47 are then isolated from the respective reference integration nodes 60 by turning off the pass transistors 59 (instant t2), and, subsequently, the first reference current generator 44 and the second reference current generator 45 are activated (instant t3). In this way, the charge-regeneration capacitors 62 of the first reference circuit 46 and second reference circuit 47 are discharged linearly respectively with the first reference current IR1 and the second reference current IR2 (step of integration of the currents IR1, IR2) up to the pre-set instant t4, at which the reference current generators 44, 45 are deactivated. Next, a charge-sharing step is carried out (instant t5), during which the charge lost by the integration capacitors 53 of the first reference circuit 46 and second reference circuit 47 is restored using the charge present in the respective charge-regeneration capacitors 62.

At the end of the reading step, on the reference transfer nodes 54 of the first reference circuit 46 and second reference circuit 47 there are respectively present the maximum reference voltage VR1 and the minimum reference voltage VRN−1. Through the follower stages 49, 50, the said maximum reference voltage VR1 and minimum reference voltage VRN−1 are respectively supplied to the output terminals 42.1 and 42.N−1 of the reference generating circuit 42. Consequently, on the intermediate output nodes 42.2, . . . , 42.N−2 of the reference generating circuit 42 there are present the intermediate reference voltages VR2, . . . , VRN−2, which are at equal distances apart.

As has already been mentioned, following upon variations in the process conditions, in temperature, or in the biasing voltage Vpcx, the currents absorbed by the cells 136, 236, and hence also the voltages present in the memory device 35, may depart from the nominal values. On the other hand, it is known that these variations normally affect the entire memory device 35 uniformly. Given that the read circuit 20 and the reference circuits 46, 47 have identical structures and that, moreover, the same procedure is used to detect the current absorbed by the current generator 10 and by the reference current generators 44, 45, the voltage Va on the charge-integration node 28 of the read circuit 20 and the maximum reference voltage VR1 and minimum reference voltage VRN−1 substantially vary to the same extent. Clearly, also the intermediate reference voltages VR2, . . . , VRN−2, which are generated starting from the maximum reference voltage VR1 and minimum reference voltage VRN−1 by means of the voltage divider 48, present similar variations.

In practice, the voltage Va on the charge-integration node 28 of the read circuit 20 still depends in an absolute sense upon the aforementioned types of disturbance, but the undesired variations are compensated for by the variations in the reference voltages VR1, VR2, . . . , VRN−1. In other words, the relative value of the voltage Va on the charge-integration node 28 of the read circuit 20 with respect to the reference voltages VR1, VR2, . . . , VRN−1 depends only upon the programming level of the memory cell 136 that is being read and is not significantly affected by the temperature, the supply voltage, or the process conditions.

This is clearly advantageous, in so far as the likelihood that reading errors may occur is considerably reduced, and consequently the memory device 35 is, as a whole, more precise.

A further advantage of the invention is represented by the fact that, since the maximum reference voltage VR1 and minimum reference voltage VRN−1 do not vary with respect to one another, also the relative distances between the intermediate reference voltages VR2, . . . , VRN−2 remain unvaried and substantially equal to the nominal distances.

In addition, in order to generate the reference voltages it is sufficient to use two reference cells and two respective reference circuits, and hence the memory device has, on the whole, contained overall dimensions. Also programming of the reference cells, which must in any case be carried out in the factory before the memory is used and which is normally a complex and time-consuming process, is considerably simplified. In fact, programming of each individual reference cell must be performed with a high degree of precision, and hence requires a relatively long time. Clearly, this may constitute a problem when the use of numerous reference cells is envisaged; according to the present invention, instead, the reference cells are only two, and consequently the time required for their programming is, on the whole, reduced.

Finally, it is clear that numerous modifications and variations may be made to the reference generation method and circuit described and illustrated herein, all falling within the scope of the inventive idea, as defined in the attached claims.

In particular, it is possible to supply the currents I, IR1, IR2 to the current generator 10 and to the reference current generators 44, 45 directly through the charge-regeneration capacitors 22, 62. For this purpose, the second control signal Vp is always kept at a high level, so that the pass transistors 27, 59 will remain constantly on. The charge-regeneration capacitors 22, 62 hence discharge linearly over time, whilst the charge-integration capacitors 23, 53 have no effect, in so far as the voltages on the charge-transfer node 11 and on the reference transfer node 54 remain substantially constant on account of the presence of the decoupling stages 21, 55.

The read circuit 20 and the reference circuits 46, 47 may have a structure different from the one described, provided that they are identical to one another. For example, each of them may comprise a plurality of charge-regeneration capacitors 22, 62 which are charged at the biasing voltage Vpcx and are then connected alternately and in succession to the charge-integration node 28. In this case, given the same supply voltage, a higher number of bits can be stored in each cell; on the other hand, given the same number of bits per cell, it is possible to reduce the supply voltage. In addition, the decoupling circuits may be implemented also in a way different from the one that has been described, typically by supplying the cascode transistors with pre-set biasing voltages which modulate the conductivity of said transistors also according to the voltage Vb on their terminals which are connected to the memory cell (drain terminals), and hence eliminating the inverting elements. In some embodiments the pass transistors may be absent.

Finally, the present method can be used for generating the reference voltages required, also in the case of reading in current or in voltage, according to traditional procedures.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A circuit for generating reference voltages for reading a multilevel memory cell, comprising:

a first reference cell and a second reference cell having, respectively, a first reference programming level and a second reference programming level;

a first reference circuit and a second reference circuit respectively connected to said first and said second reference cells and having respective output terminals which respectively supply a first reference voltage and a second reference voltage; and a voltage-dividing circuit having a first connection node and a second connection node respectively connected to said output terminals of said first reference circuit and of said second reference circuit to receive, respectively, said first reference voltage and said second reference voltage, and a plurality of intermediate nodes supplying respective third reference voltages at equal distances apart.

2. The circuit according to claim 1, wherein said first reference circuit and said second reference circuit comprise respective capacitive elements respectively connected to said first and said second reference cells and respectively supplying a first constant current and a second constant current when said first and second reference cells are activated.

3. The circuit according to claim 2, wherein said capacitive elements of said first and second reference circuits comprise respective first capacitors respectively connected to said first and said second reference cells, and respective second capacitors, and in that said first and second reference circuits comprise respective decoupling stages respectively set between said first capacitor and said second capacitor of said first reference circuit and between said first capacitor and said second capacitor of said second reference circuit.

4. The circuit according to claim 3, wherein said decoupling stages comprise respective cascode stages.

5. The circuit according to claim 3, comprising a biasing line, and in that said first and second reference circuits comprise respective switching means for alternately connecting and disconnecting said biasing line and said second capacitors.

6. A multilevel memory comprising:
a memory array made up of a plurality of memory cells;
a read circuit for reading said memory cells; and
a circuit for generating reference voltages, including a first reference cell and a second reference cell having, respectively, a first reference programming level and a second reference programming level, a first reference circuit and a second reference circuit respectively connected to said first and said second reference cells and having respective output terminals which respectively supply a first reference voltage and a second reference voltage; and
a voltage-dividing circuit having a first connection node and a second connection node respectively connected to said output terminals of said first reference circuit and of said second reference circuit to receive, respectively, said first reference voltage and said second reference voltage, and a plurality of intermediate nodes supplying respective third reference voltages at equal distances apart.

7. The memory according to claim 6, wherein said first reference circuit and said second reference circuit of said circuit for generating reference voltages are structurally identical to said read circuit.

8. A method for generating reference voltages for reading a multilevel memory cell, comprising:
reading a first memory cell and a second memory cell respectively having a first reference programming level and a second reference programming level for generating, respectively, a first reference voltage and a second reference voltage; and generating a plurality of third reference voltages which are intermediate between said first reference voltage and said second reference voltage and are at equal distances apart.

9. The method according to claim 8, in which said reading step comprises:
supplying said reference cells respectively with a first reference current and a second reference current by means of respective capacitive elements and integrating said first and second reference currents in time.

10. The method according to claim 8, further comprising the steps of:
charging first capacitors of said first and second reference circuits to a first charge value, and charging second capacitors of said first and second reference circuits to a second charge value;
discharging said first capacitors of said first and second reference circuits, respectively through said first reference cell and said second reference cell, respectively with said first current and said second current in a pre-set period of time;
in each of said first and second reference circuits, sharing said first charge between said first capacitor and said second capacitor; and
detecting a voltage present on said first capacitors of said first and second reference circuits in order to measure the charge shared.

11. A device, comprising:
first, second and third memory cells, each memory cell configured to be programmed at any one of a plurality of programming levels; the first memory cell being programmed at a highest one of the plurality of programming levels; the second memory cell being programmed at a lowest one of the plurality of programming levels; the third memory cell being programmed at one of the plurality of programming levels;
a first reference circuit, coupled to the first memory cell and configured to produce a first voltage level at a first reference output, the first voltage level corresponding to the programming level stored in the first memory cell;
a second reference circuit, coupled to the second memory cell and configured to produce a second voltage level at a second reference output, the second voltage level corresponding to the programming level stored in the second memory cell, the first voltage level and the second voltage level having a voltage difference therebetween;
a read circuit, coupled to the third memory cell and configured to produce a read voltage level at a read output, the read voltage level corresponding to the programming level stored in the third memory cell;
a voltage divider circuit having a first input coupled to the first reference output, a second input coupled to the second reference output and a plurality of divider outputs, the voltage divider circuit being configured to divide the voltage difference between the first and second voltage levels into a plurality of divider voltage levels and further configured to couple the first and second voltage levels and each of the plurality of divider voltage levels to a respective one of the divider outputs; and
a converter circuit having a plurality of reference inputs coupled to respective divider outputs, and a read input coupled to the read output and a digital output, the converter circuit being configured to determine to which of the plurality of programming levels the third memory cell is programmed and to provide a corresponding digital signal at the digital output.

12. A method, comprising:

producing a read voltage level, corresponding to a programming level stored in a memory cell to be read;

producing a first voltage level, corresponding to a programming level stored in a first reference cell, the first reference cell having been programmed to a known, highest level of a plurality of programming levels to which the first reference cell or the memory cell may be programmed;

producing a second voltage level, corresponding to a programming level stored in a second reference cell, the second reference cell having been programmed to a known, lowest level of a plurality of programming levels to which the first or second reference cell or the memory cell may be programmed;

generating a plurality of additional voltage levels that are intermediate between the first voltage level and the second voltage level and are at equal distances apart;

comparing the read voltage level to the first and second voltage levels and to the plurality of additional voltage levels; and outputting a numerical value corresponding to the programming level of the memory cell, as determined in the comparing step.

13. The method of claim 12 wherein:

the memory cell and the first and second reference cells are substantially identical;

the first and second voltage levels are produced by first and second read circuits coupled to the first and second reference cells, respectively;

the read voltage level is produced by a third read circuit selectively coupled to the memory cell; and the first, second and third read circuits are substantially identical.

14. The method of claim 13, further comprising coupling the third read circuit to a second memory cell.

* * * * *